United States Patent
Liu et al.

(10) Patent No.: US 11,594,874 B2
(45) Date of Patent: Feb. 28, 2023

(54) METHOD FOR DETECTING FAULT IN POWER TRANSMISSION LINE AND PROTECTION SYSTEM USING THE SAME

(71) Applicant: Hitachi Energy Switzerland AG, Baden (CH)

(72) Inventors: Kai Liu, Beijing (CN); Jianping Wang, Västerås (SE); Youyi Li, Västerås (SE)

(73) Assignee: HITACHI ENERGY SWITZERLAND AG, Baden (CH)

( * ) Notice: Subject to any disclaimer, the term of this patent is extended or adjusted under 35 U.S.C. 154(b) by 834 days.

(21) Appl. No.: 16/440,236

(22) Filed: Jun. 13, 2019

(65) Prior Publication Data

US 2019/0296543 A1   Sep. 26, 2019

Related U.S. Application Data

(63) Continuation of application No. PCT/CN2017/088416, filed on Jun. 15, 2017.

(51) Int. Cl.
*H02H 7/26* (2006.01)
*H02H 1/00* (2006.01)
*H02H 3/40* (2006.01)

(52) U.S. Cl.
CPC ............ *H02H 7/26* (2013.01); *H02H 1/0007* (2013.01); *H02H 3/40* (2013.01)

(58) Field of Classification Search
CPC ........... H02H 7/26; H02H 1/0007; H02H 3/40
See application file for complete search history.

(56) References Cited

U.S. PATENT DOCUMENTS

| | | | |
|---|---|---|---|
| 4,841,405 A * | 6/1989 | Udren | H02H 7/26 |
| | | | 702/58 |
| 2014/0200726 A1 | 7/2014 | Balcerek et al. | |
| 2017/0146613 A1 | 5/2017 | Schweitzer, III et al. | |

FOREIGN PATENT DOCUMENTS

| | | |
|---|---|---|
| CN | 102064538 A | 5/2011 |
| CN | 102361320 A | 2/2012 |

(Continued)

OTHER PUBLICATIONS

Shi Chen, "Adaptive distance protection for grounded fault of lines connected with doubly-fed induction generators"., IET Gener. Transm. Distrib., 2017, vol. 11 Iss. 6, pp. 1513-1520 © The Institution of Engineering and Technology 2017 (Year: 2017).*

Liu, Huanzhang, CN102064538 machine translation with paragraphs May 18, 2011 (Year: 2011).*

(Continued)

*Primary Examiner* — Yoshihisa Ishizuka
(74) *Attorney, Agent, or Firm* — Slater Matsil, LLP

(57) ABSTRACT

A method for detecting fault in a power transmission line of a power transmission system and protection system using the same. The method includes: obtaining a system parameter of the power transmission system, adjusting protection reachability of a fault detecting element based on the obtained system parameter such that the adjusted protection reachability of the fault detecting element is applicable to a predetermined protection range, identifying whether there is an internal fault occurring on the transmission line using the adjusted fault detecting element, and generating a fault detection decision signal indicating the identified fault. If the predetermined protection range is desirable for the fault detecting element, its protection reachability may be adjusted in consideration of the influence imposed by the SIR such that the reach point of the adjusted fault detecting element can be extended to approach the end of the prede- (Continued)

termined protection range. Consequently, the influence on its accuracy by various SIR values can be taken into account and accordingly the fault detecting solution can remove substantial errors as a result thereof.

12 Claims, 3 Drawing Sheets

(56) References Cited

FOREIGN PATENT DOCUMENTS

| CN | 102868150 A | 1/2013 | | |
|---|---|---|---|---|
| CN | 103733458 A | 4/2014 | | |
| CN | 104917161 A | 9/2015 | | |
| CN | 106684835 A | 5/2017 | | |
| CN | 106796257 A | 5/2017 | | |
| DE | 19920654 A1 | * 11/2000 | ............. | G01R 27/16 |
| WO | 2016044469 A1 | 3/2016 | | |

OTHER PUBLICATIONS

Intellectual Property Office of the P.R. China, International Search Report & Written Opinion issued in corresponding Application PCT/CN2017/088416, dated Mar. 16, 2018, 10 pp.

Schweitzer, III et al., "Speed of Line Protection—Can We Break Free of Phasor Limitations?" Schweitzer Engineering Laboratories, Inc., 2014, 14 pp.

RCS931 line differential protection technical manual, NARI, including English machine translation of Section 3.4 Power frequency variation distance relay, 73 pp.

Blumschein et al., "Directional Comparison based on High-Speed-Distance Protection using Delta Quantities," Siemens AG, Infrastructure & Cities Sector, 7 pp.

Nimmersjö et al., "A New Approach to High Speed Relaying Based on Transient Phenomena," ABB Relays AB, Sweden, pp. 140-145.

You-Yi et al., "Fault Phase Selector by Fault Component of Compensation Voltage Based on Traveling Wave," Automation of Electric Power Systems, vol. 30, No. 8, Apr. 25, 2006, pp. 37-40.

* cited by examiner

METHOD FOR DETECTING FAULT IN POWER TRANSMISSION LINE AND PROTECTION SYSTEM USING THE SAME

TECHNICAL FIELD

The invention relates to detecting faults in power transmission line of power transmission system, and more particularly to locating the faults based on distance protection algorithm.

BACKGROUND ART

Dependability and security of fault detection are important to all power transmission system in order to insure reliable economic operation of the given system. They depend on rapid detection and isolation of any fault occurring within the power transmission system. In order to quickly isolate and repair such a fault, the fault must be distinguished whether the fault occurs in the protection range. Normally, dependability means that a protection system should detect fault and isolate the fault when the fault is internal and security means the protection system should not trip or isolated the faults if it is external fault.

In general, a reliability factor K is introduced for Zone 1 setting in the line distance protection in order to cover possible errors such as current, voltage measurement errors, line parameter errors, etc. For distance protection, Zone 1 is usually set in the range of 75%-90% of total power transmission line length. For the voltage change based distance protection application, a fault detecting element may be constructed by using fault voltage change, system parameter like rated voltage of the transmission line, and a reliability coefficient like the margin. A short explanation can be provided here based on FIG. 1, which is a diagram of protection reachability of the fault detecting element for various values of source impedance ratio of the power transmission system according to the test results. The source impedance ratio (SIR) is defined by the equation below:

$$SIR = Z_S / Z_{Set}$$

where $Z_S$ is source impedance for the given protected power transmission line, and $Z_{Set}$ is impedance setting of the transmission line. With the variance of the source impedance $Z_S$, the SIR of the power transmission system will change accordingly.

As shown in FIG. 1, the protection reachability of the fault detecting element under various SIR values is illustrated by the lines 10, 11, 12, 13, and each of them ends at its reach point RP0, RP1, RP2, RP3. In particular for example, line 10 illustrates the protection range of the fault detecting element used for a system having SIR of 1.0, line 11 illustrates the protection range of the fault detecting element used for a system having SIR of 0.8, line 12 illustrates the protection range of the fault detecting element used for a system having SIR of 0.5, and line 13 illustrates the protection range of the fault detecting element used for a system having SIR of 0.2. It can be observed that the protection reachability of the fault detecting element varies in a reverse direction to the change of SIR of the power transmission system. It is assumed that there is an internal fault either at points A though C on the power transmission line. For example, for an internal fault within the protection reachability of the fault detecting element 10, 11, 12, 13, e.g. at point A, all of the four fault detecting elements will give the correct fault detection decision. For an internal fault beyond the reachability represented by line 10 but within those represented by line 11, 12, 13, e.g. at point B, the fault detecting element used for a system having SIR of 1.0 will meet under-reach issue, while fault decision by the other for system having SIR of 0.8, 0.5, 0.2 will still be correct. For an internal fault beyond the reachability represented by line 10, 11 but within those represented by line 12, 13, e.g. at point C, the fault detecting element with SIR of 1.0, 0.8 will meet under-reach issue too, while fault decision by the other with SIR of 0.5, 0.2 will still be correct. A problem with the known fault detecting element is that the influence on its accuracy by various SIR values is not generally taken into account and accordingly the fault detecting solution can create substantial errors as a result thereof.

BRIEF SUMMARY OF THE INVENTION

According to one aspect of present invention, it provides a method for detecting fault in a power transmission line of a power transmission system, including steps of:
(a) obtaining a system parameter of the power transmission system;
(b) adjusting protection reachability of a fault detecting element based on the obtained system parameter such that the adjusted protection reachability of the fault detecting element is applicable to a predetermined protection range;
(c) identifying whether there is an internal fault occurring on the transmission line using the adjusted fault detecting element; and
(d) generating a fault detection decision signal indicating the identified fault.

According to another aspect of present invention, it provides a protection system for detecting fault in a power transmission line of a power transmission system, including:
a processor, being configured to adjust protection reachability of a fault detecting element based on obtained system parameter of the power transmission system such that the adjusted protection reachability of the fault detecting element is applicable to a predetermined protection range, identify whether there is an internal fault occurring on the transmission line using the adjusted fault detecting element, and generate a fault detection decision signal indicating the identified fault.

From observation of test results, it can be seen that the protection reachability of the fault detecting element varies in a reverse direction to the change of the SIR. Simulation results testified this conclusion, and the reason behind is analysed as below:
(1) The voltage change may be relatively large (for example more than 10×Rated voltage) when SIR is small (for example less than 0.1×Rated voltage), so the fault detecting element can work well for small SIR condition;
(2) With relatively large SIR value, the difference in between fault occurs at the start of the protection range and fault occurs at the end of protection range becomes smaller, it is the reason why the dependability of the fault detecting element decreases with the increase of SIR; and
(3) The voltage change is close to rated voltage for any SIR value when faults occur at the end of the protection range.

This provides the principle for adjusting the fault detecting element with different SIR value to increase the sensitivity while the reliability is ensured.

By having the solutions according to present invention, if a predetermined protection range is desirable for the fault detecting element, its protection reachability may be adjusted in consideration of the influence imposed by the SIR such that the reach point of the adjusted fault detecting element can be extended to approach the end of the predetermined protection range. Consequently, the influence on its accuracy by various SIR values can be taken into account and accordingly the fault detecting solution can remove substantial errors as a result thereof.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

Figure 1:
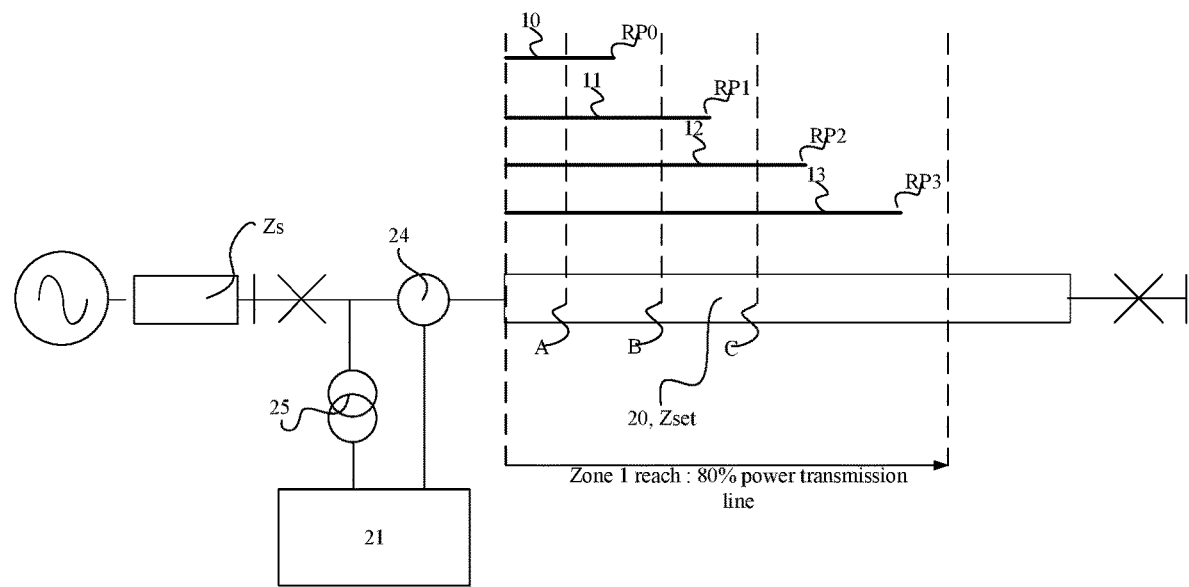
FIG. 1 is a a diagram of protection reachability of the fault detecting element for various values of source impedance ratio of the power transmission system according test results.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims.

Figure 2:
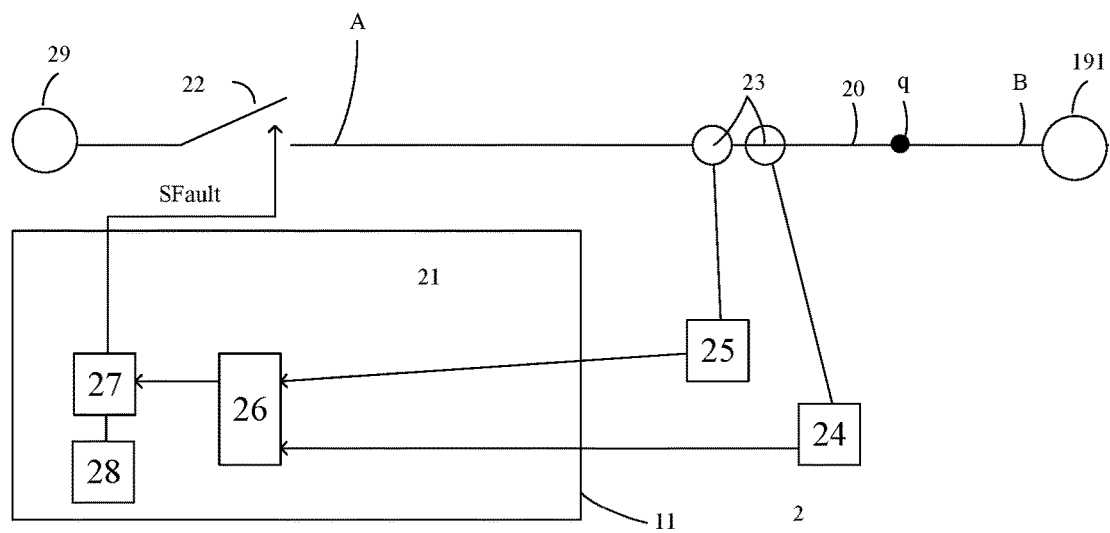
FIG. 2 shows a protection system for detecting fault in a power transmission line of a power transmission system according to an embodiment of present invention.

Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected". FIG. 2 shows a protection system for detecting fault in a power transmission line of a power transmission system according to an embodiment of present invention. As shown in FIG. 2, the power transmission system 2 includes a transmission line 20. The protection system 21, in the event of a fault, may disconnect the affected transmission line 20, for example by power circuit breaker 22. An AC source 29 is provided to be connected to the power circuit breaker 22 which further connects with the end A of the transmission line 20. The protection system 21 is provided for this purpose at one of the line ends A and B at measurement points 23. Electric signals, such as current and voltage signals, appear at the measurement point 23 is transformed by current transformer 24 and voltage transformer 25 and are fed to the protection system 21 and sampled by its sampling circuit 26.

The protection system 21 samples the current and voltage signals by sampling circuits 26 of an A/D conversion at a series of time points, and performs a fault identification, by its processor 27, for the current and voltage sampled values thus generated so as to be able to detect fault of the transmission line 20. In the event of such a fault, it may be single phase fault of short circuit between a phase and the ground, phase-phase fault of short circuit between any two phases, two phases to ground fault of short circuit between either of two phases and the ground, and three phase fault of short circuits among three phases. If the control system 21 identifies a fault, for example by its processor 27, a fault signal $S_{fault}$ indicating the identified fault type is thus generated by the processor 27, which is used to initiate tripping signal to the power circuit breaker 22 so as to allow said power circuit breaker to open its switching contacts and to disconnect the line affected by the short circuit from the rest of the energy supply network. A storage circuit 28 is connected to the processor 27 for storing data.

The protection system 21 includes an input device coupled to the storage circuit 28, which in turn can communicate with the processor 27. A system parameter of the power transmission system 2, e.g. the SIR, may be introduced into the protection system 21 in any desired fashion, for example through the input device. Or, source impedance of the power transmission system $Z_S$ and impedance setting of the transmission line $Z_{Set}$, may be stored in the storage circuit 28. Such information stored in the storage circuit 28 is processed by the processor 27 in cooperation with a program stored in the storage circuit 28 to calculate the SIR of the power transmission system from the equation (1) below:

$$SIR = Z_S/Z_{Set} \qquad (1)$$

where $Z_S$ is the source impedance of the power transmission system, and $Z_{Set}$ is impedance setting of the transmission line. Processor 27 may be of any known type and operates under the program disclosed in greater detail hereafter.

While the methods employed by the teachings of the present invention are principally described in detail for a single phase of the power transmission system, the concept of the present invention are equally applicable for multi-phase distribution systems. In such a case, the voltage and the current would be measured for each of the phases.

According to a first embodiment of present invention, the processor 27 may apply computed instantaneous voltage values at a compensated point q on the transmission line 20 to the fault detecting element for the identification of the internal fault. The algorithm for the computation will be discussed hereafter. The fault detecting element uses criteria (2):

$$\begin{cases} |\Delta U_q| > K_{rel} \times U_N \\ \Delta U_q = U_q - U_q' \end{cases} \qquad (2)$$

where $U_q$ and $U_q'$ respectively indicate the computed instantaneous voltage values for two of the series of time points, $U_N$ indicates rated voltage of the transmission line, and $K_{rel}$ indicates reliability coefficient. In the first embodiment, for example the reliability coefficient $K_{rel}$ may be initially set at 1.3. In this example, the criteria will be initially set as:

$$\begin{cases} |\Delta U_q| > 1.3 \times U_N \\ \Delta U_q = U_q - U'_q \end{cases} \quad (3)$$

If it is true, then the processor 27 decides there is an internal fault with the power transmission line. Thus, the processor 27 may identify whether there is an internal fault occurring on the transmission line using the fault detecting element, and generate a fault detection decision signal indicating the identified fault.

From the observation, it can be seen that the protection reachability of the fault detecting element varies in a reverse direction to the change of the SIR. Simulation results testified this conclusion, and the reason behind is analysed as below:
(1) The voltage change $\Delta U_q$ may be relatively large (for example more than 10×Rated voltage) when SIR is small (for example less than 0.1×Rated voltage), so the fault detecting element can work well for small SIR condition;
(2) With relatively large SIR value, the difference in $\Delta U_q$ between fault occurs at the start of the protection range and fault occurs at the end of protection range becomes smaller, it is the reason why the dependability of the fault detecting element decreases with the increase of SIR; and
(3) The voltage change $\Delta U_q$ is close to rated voltage for any SIR value when faults occur at the end of the protection range.

This provides the principle for adjusting the fault detecting element with different SIR value to increase the sensitivity while the reliability is ensured.

If a predetermined protection range is desirable for the fault detecting element, its protection reachability needs to be adjusted in consideration of the influence imposed by the SIR such that the reach point of the adjusted fault detecting element can be extended to approach the end of the predetermined protection range.

Figure 3:
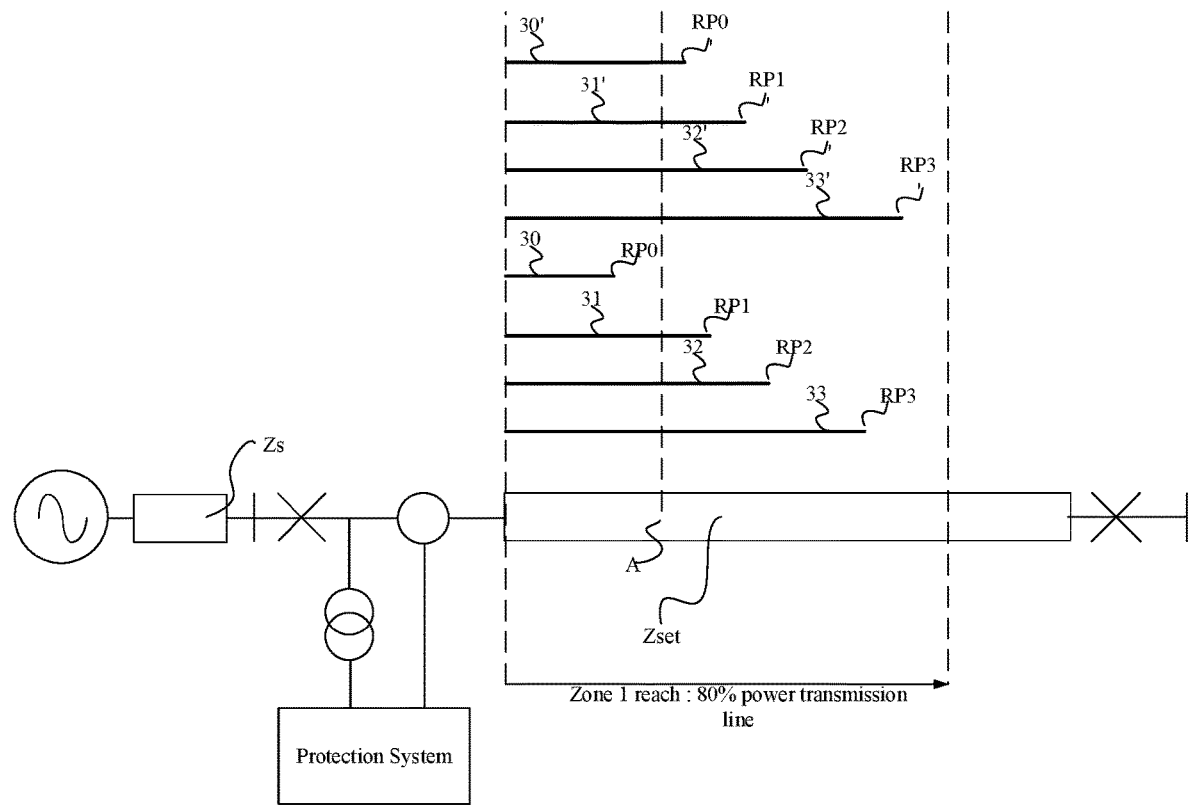
FIG. 3 shows adjustment of protection reachability of the fault detecting element according to the first embodiment.

FIG. 3 shows adjustment of protection reachability of the fault detecting element according to the first embodiment. In this embodiment, for example, the fault detecting element may be adjusted by changing its reliability coefficient $K_{rel}$ as below:

$$K_{rel} = \begin{cases} 1.3, & SIR \leq 0.5 \\ 1.2, & 0.5 < SIR \leq 3 \\ 1.05, & 3 < SIR \leq 5 \end{cases} \quad (4)$$

The reliability coefficient $K_{rel}$ of the fault detecting element is adjusted above a first threshold of 1.2 where the system parameter (SIR) is below a second threshold of 3. The reliability coefficient $K_{rel}$ of the fault detecting element is adjusted below the first threshold of 1.2 where the obtained system parameter is above the second threshold of 3.

As shown in FIG. 3, before the adjustment, the protection reachability of the fault detecting element under various SIR values 0.3, 0.8, 2.3, 4 is illustrated by the lines 30, 31, 32, 33, and each of them ends at its reach point RP0, RP1, RP2, RP3. The protection range decreases successively defined by lines 30 through 33. The fault detecting element for the system having SIR value of 4 might give an incorrect fault detection decision signal for an internal fault occurring at point A since its reach point RP3 does not reach the location of the point A on the power transmission line. Therefore, a fault occurring therebetween, for example, at point A, cannot be detected.

With the adjustment of the reliability coefficient $K_{rel}$ according to the first embodiment, the protection range of the fault detecting element for a system having SIR value 0.3 keeps unchanged indicated by the dash-line 30' terminated at reach point RP0', those for SIR value 0.8, 2.3, 4 are elongated indicated by the dash-line 31', 32', 33' terminated at reach point RP1', RP2', RP3". Since all of the reach points RP0', RP1', RP2', RP3' goes beyond the location of point A on the power transmission line, the adjusted fault detecting element for the power transmission system having SIR value of 0.3, 0.8, 2.3, 4 will give a correct fault detection decision signal. This is verified by test results and simulation results.

As an alternative, according to a second embodiment of present invention, the processor 27 may apply instantaneous voltage values at a compensated point q to the adjusted fault detecting element for the identification of the internal fault. The fault detecting element uses criteria (5):

$$\begin{cases} |\Delta U_q| > K_{rel} \times U'_q \\ \Delta U_q = U_q - U'_q \end{cases} \quad (5)$$

where $U_q$ and $U_q'$ respectively indicate the instantaneous voltage values for two of the series of time points, and $K_{rel}$ indicates reliability coefficient.

The sampling circuit 26 may sample current values and voltage values at one end of the transmission line for a series of time points. And, the processor 27 may compute and thus obtain the instantaneous voltage values at the compensate d point q on the transmission line from the current value samples and the voltage value samples based on a time domain lumped parameter differential equation based on RLC model or RL model for the transmission line for the series of time points.

The solutions explained hereinafter is used for fault direction identification using voltage fault component and current fault component at compensation point q on the transmission line 10 (as shown in FIG. 1) based on the current and voltage sampled values, which are established by the principle of time domain lumped parameter differential equation for the transmission line, which will therefore first be explained briefly hereinafter. The compensated point may be midpoint of the transmission line or other pre-set point. The time domain lumped parameter model may be for example an RLC model or an RL model. RLC model is used for an example illustrating the present invention hereinafter.

The RLC model is one of the lumped parameter model and it is an example equivalent model used for the electrical line in the present invention. The RLC model comprises a resistor, an inductor and a capacitor. In other words, the whole transmission line can be represented by an equivalent circuit containing a resistor, an inductor and a capacitor. For illustrative purposes, reference is made to FIG. 4 to describe an example RLC model for a transmission line system.

Figure 4:
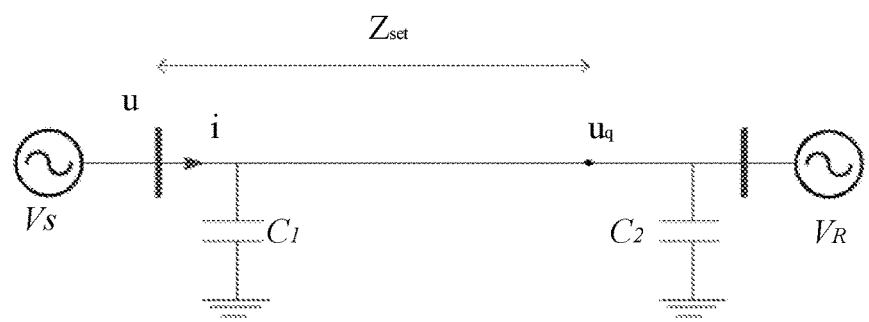
FIG. 4 illustrates an example RLC model for a transmission line system.

As illustrated in FIG. 4, the RLC model is a standard PI-type line model. The voltage at the start point is denoted by $V_S$ and the voltage at the end point is denoted by $V_R$; the voltage and current at the measurement point are denoted by u and i respectively, the voltage at a setting point is denoted by $u_q$. The transmission line between the start point and the end point can be equivalent to a resistor and an inductor connected in series and two capacitors $C_1$ and $C_2$ which are respectively connected to the start point and the end point of the transmission line.

The impedance of the protection zone can be denoted by $Z_{set}$ in fundamental frequency domain $$Z_{set} = R + jX \qquad (6)$$

Where $Z_{set}$ denotes the impedance of the protection zone, R denotes the resistance of the equivalent resistor of the transmission line and X denotes the inductance of the equivalent inductor of the transmission line. It shall be understood that although FIG. 4 illustrates the RLC model as a PI-type RLC model, the present invention is not limited thereto. The RLC model can also be any other forms of RLC model, a T-type RLC model, Tau-type RLC model, or some modified versions thereof. In addition, it may also use a further simplified RL model for the transmission line system. In some embodiments of the present invention, it can erase a capacitive current in a phase current. That is to say, after a phase current is obtained, at least one of a capacitive current to the ground and a capacitive current between phases can be removed from the obtained phase current.

Figure 5:
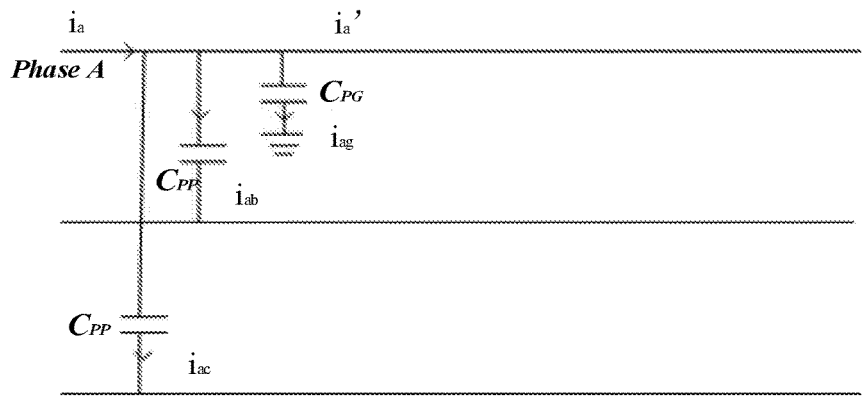
FIG. 5 schematically illustrates of a diagram of a capacitive current path for phase A according to an embodiment of the present invention.

For illustration purposes, FIG. 5 schematically illustrates of a diagram of a capacitive current path for phase A according to an embodiment of the present invention. As illustrated in FIG. 5, for phase A, there is a capacitance $C_{PG}$ of the line for phase A to the ground, a first capacitance $C_{PP}$ between the line for phase A and the line for phase B, and a second capacitance $C_{PP}$ between the line for phase A and the line for phase C. The capacitive currents related to capacitances $C_{PG}$, the first $C_{PP}$ and the second $C_{PP}$ are denoted by $i_{ag}$, $i_{ab}$, $i_{ac}$, respectively. The currents $i_{ag}$, $i_{ab}$, $i_{ac}$ can be obtained by following equations:

$$i_{ag} = C_{PG} \times \frac{du_a}{dt} \qquad (7)$$

$$i_{ab} = C_{PP} \times \frac{du_{ab}}{dt} \qquad (8)$$

$$i_{ac} = C_{PP} \times \frac{du_{ac}}{dt} \qquad (9)$$

wherein $u_a$ represents the phase voltage of phase A; $u_{ab}$ represents a voltage difference between the phase voltage $u_a$ and a phase voltage $u_b$, i.e., $u_{ab} = u_a - u_b$; $u_{ac}$ represents a voltage difference between the phase voltage $u_a$ and a phase voltage $u_c$, i.e., $u_{ac} = u_a - u_c$. Thus, the current $i_a'$, which represents a current of phase A by removing the capacitive current impact can be determined based on the following equations.

$$i_a' = i_a - \left( C_{PG} \times \frac{du_a}{dt} + C_{PP} \times \frac{du_{ab}}{dt} + C_{PP} \times \frac{du_{ac}}{dt} \right) \qquad (10)$$

Similarly, currents $i_b'$, $i_c'$ can represent phase currents by removing the capacitive current impact for phase B and phase C, respectively, and they can be determined as follows:

$$i_b' = i_b - \left( C_{PG} \times \frac{du_b}{dt} + C_{PP} \times \frac{du_{ba}}{dt} + C_{PP} \times \frac{du_{bc}}{dt} \right) \qquad (11)$$

$$i_c' = i_c - \left( C_{PG} \times \frac{du_c}{dt} + C_{PP} \times \frac{du_{ca}}{dt} + C_{PP} \times \frac{du_{cb}}{dt} \right) \qquad (12)$$

wherein $u_b$ represents the voltage of phase B; $u_c$ represents the voltage of phase C; $u_{ba}$ represents the voltage difference between the phase voltage $u_b$ and the phase voltage $u_a$, i.e., $u_{ba} = u_b - u_a$; $u_{ca}$ represents the voltage difference between the phase voltage $u_c$ and the phase voltage $u_a$, i.e., $u_{ca} = u_c - u_a$; $u_{bc}$ represents the voltage difference between the phase voltage $u_b$ and the phase voltage $u_c$, i.e., $u_{bc} = u_b - u_c$; $u_{cb}$ represents the voltage difference between the phase voltage $u_c$ and the phase voltage $u_b$, i.e., $u_{cb} = u_c - u_b$.

Figure 6:
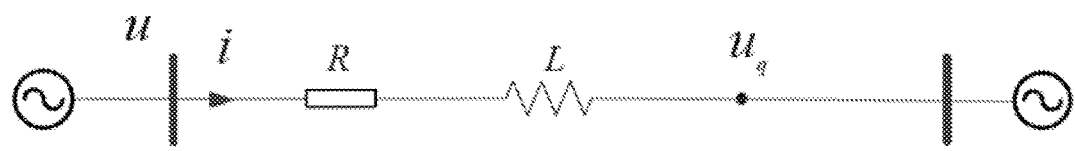
FIG. 6 schematically illustrates a single line diagram for the transmission line according to an embodiment of the present invention.

Thus, in embodiments of the present invention, it may use the current $i_a'$, $i_b'$, $i_c'$, which have subtracted the capacitive currents, instead of the original sampled currents $i_a$, $i_b$, $i_c$. If the capacitive currents are erased from the phase current, then the model of the transmission can be further reduced. For illustration purposes, FIG. 6 schematically illustrates a single line diagram for the transmission line according to an embodiment of the present invention. FIG. 6 is similar to that model as illustrated in FIG. 4, but resistor R and inductor L are illustrated in details and capacitors connected at the start point and the end point are removed since the capacitive currents are removed from the phase current.

Based on the single line diagram as illustrated in FIG. 6, the voltage at the setting point $u_q$ can be determined based on a differential equation such as:

$$u_q(t) = u(t) - R * i(t) - L * \frac{di(t)}{dt} \qquad (13)$$

wherein u(t) represents the voltage at the measurement point; i(t) represents the current at the measurement point, R represents a resistance value of a resistor in the lumped parameter model, and L represents an inductance value of an inductor in the lumped parameter model and di(t)/dt represents the differential value of the current i(t). If we consider the discrete time system domain, for example a sample point at time instant k, the following equation (13') can be used to represent the calculation in equation (13).

$$u_{q\_k}(t) = u_k - \left( R \cdot i_k + L \cdot \frac{di_k}{dt} \right) \qquad (13')$$

wherein $u_{q\_k}$ represents the voltage at the setting point; $u_k$ represent the voltage at the measurement point; $i_k$ represents the current at the measurement point and L represents the inductance of inductor in the lumped parameter model (for example the RLC model); R represents the resistance of a resistor in the lumped parameter model (for example the RLC model); $di_k/dt$ represents the differential value of the current $i_k$ ($di_k = i_k - i_{k-1}$; dt=a sample interval for the given sampling rate; $i_{k-1}$ means the measured current at the time instant k−1 which is previous of time instant k in the discrete time domain)

Figure 7:
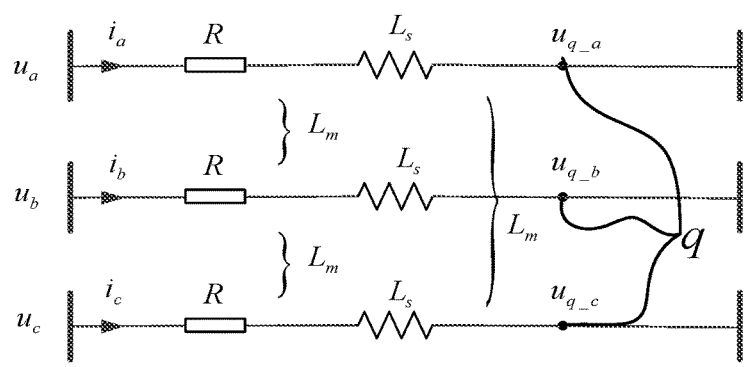
FIG. 7 shows three-phase transmission line diagram.

FIG. 7 shows three-phase transmission line diagram. As shown in FIG. 7, Ls is the phase inductance, Lm is the mutual inductance between phases, and k is the sampling time point. With the three-line diagram, it may determine voltages $u_{q\_a\_k}$, $u_{q\_b\_k}$ and $u_{q\_c\_k}$ based on equation (13) by further taking mutual inductance between phases into consideration. For example, voltage $u_{q\_a\_k}$, $U_{q\_b\_k}$ and $u_{q\_c\_k}$, can be determined based on the differential equation such as:

$$\begin{cases} u_{q\_a\_k} = u_{a\_k} - \left[ R \cdot i_{a\_k} + L_s \cdot \frac{di_{a\_k}}{dt} + L_m \cdot \frac{di_{b\_k}}{dt} + L_m \cdot \frac{di_{c\_k}}{dt} \right] \\ u_{q\_b\_k} = u_{b\_k} - \left[ R \cdot i_{b\_k} + L_s \cdot \frac{di_{b\_k}}{dt} + L_m \cdot \frac{di_{a\_k}}{dt} + L_m \cdot \frac{di_{c\_k}}{dt} \right] \\ u_{q\_c\_k} = u_{c\_k} - \left[ R \cdot i_{c\_k} + L_s \cdot \frac{di_{c\_k}}{dt} + L_m \cdot \frac{di_{a\_k}}{dt} + L_m \cdot \frac{di_{b\_k}}{dt} \right] \end{cases} \qquad (14)$$

wherein $u_{a\_k}$, $u_{b\_k}$ and $u_{c\_k}$ respectively represents line voltages for phase A, phase B and phase C at the measurement point; $i_{a\_k}$, $i_{b\_k}$ and $i_{c\_k}$ respectively represents currents for phase A, phase B and phase C at the measurement point; $L_s$ represents the phase inductance for phase A, phase B and phase C; and $L_m$ represents the inductance between phases for phase A, phase B and phase C. Since the phase to phase voltage is a voltage difference between one phase and another phase, thus the phase-to-phase voltages $u_{q\_ab\_k}$, $u_{q\_bc\_k}$ and $u_{q\_ca\_k}$ can be further determined based on the phase voltages $u_{q\_a\_k}$, $u_{q\_b\_k}$ and $u_{q\_c\_k}$ determined based on equation (14). For example, the voltage $u_{q\_ab\_k}$, i.e. the voltage between phase A and B at the setting point, can determined by:

$$u_{q\_ab\_k} = u_{q\_a\_k} - u_{q\_b\_k} = \qquad (15)$$
$$u_{ab\_k} - \left[R \cdot i_{ab\_k} + (L_s - L_m) \cdot \frac{di_{ab\_k}}{dt}\right] = u_{ab\_k} - \left[R \cdot i_{ab\_k} + L \cdot \frac{di_{ab\_k}}{dt}\right]$$

wherein $u_{ab\_k}$, $i_{ab\_k}$ respectively represent the voltage and current between phase A and phase B at the measurement point; R and L mean a positive sequence resistance and inductance for the phase line, L equals to the difference of Ls and Lm, i.e., $L=L_s-L_m$.

In equation (15), R and L are positive sequence resistance and inductance, $L=L_s-L_m$. Similarly, the voltages $u_{q\_bc\_k}$ and $u_{q\_ca\_k}$ can be computed too. According to the differential equation (15), the phase-to-phase voltages $u_{q\_ab\_k}$, $u_{q\_bc\_k}$ and $u_{q\_ca\_k}$ can be determined by the differential equation (16).

Equation (16) summarized the computation for these three phase-to-phase loop voltages, R and L in Equation (16) are positive sequence resistance and inductance:

$$\begin{cases} u_{q\_ab\_k} = u_{ab\_k} - \left(R \cdot i_{ab\_k} + L \cdot \frac{di_{ab\_k}}{dt}\right) \\ u_{q\_bc\_k} = u_{bc\_k} - \left(R \cdot i_{bc\_k} + L \cdot \frac{di_{bc\_k}}{dt}\right) \\ u_{q\_ca\_k} = u_{ca\_k} - \left(R \cdot i_{ca\_k} + L \cdot \frac{di_{ca\_k}}{dt}\right) \end{cases} \qquad (16)$$

wherein $u_{ab\_k}$, $i_{ab\_k}$ respectively represents the voltage and current between phase A and phase B at the measurement point; $u_{bc\_k}$, $i_{bc\_k}$ respectively represent the voltage and current between phase B and phase C at the measurement point; $u_{ca\_k}$, $i_{ca\_k}$ respectively represent the voltage and current between phase C and phase A at the measurement point; R and L mean the positive sequence resistance and inductance for the phase line, L equals to the difference of $L_s$, and Lm, i.e., $L=L_s-L_m$. Thus, we can determine the phase voltage $u_{q\_a\_k}$, $u_{q\_b\_k}$ and $u_{q\_c\_k}$ and the phase-to-phase voltages $u_{q\_ab\_k}$, $u_{q\_bc\_k}$ and $u_{q\_ca\_k}$. It shall be understood that although the phase voltages $u_{q\_a\_k}$, $u_{q\_b\_k}$ and $u_{q\_c\_k}$ and the phase-to-phase voltages $u_{q\_ab\_k}$, $u_{q\_bc\_k}$ and $u_{q\_ca\_k}$ are described as to be determined based on equation (14) and (16) respectively, the present invention is not limited to these embodiments. In fact, it is possible to use any suitable form of differential equations.

For the phase-ground loop, voltages $u_{q\_a\_k}$, $u_{q\_b\_k}$ and $u_{q\_c\_k}$ at the compensation point q are computed by equation (14). Furthermore, these three voltages at the compensation point q can be computed by equation (17), R and L in Equation (17) are positive sequence resistance and inductance, the deduction process is not described here for the simplicity and clarity.

$$\begin{cases} u_{q\_a\_k} = u_{a\_k} - \left[R \cdot (i_{a\_k} + k_R \cdot 3i_{0\_k}) + L \cdot \frac{d(i_{a\_k} + k_L \cdot 3i_{0\_k})}{dt}\right] \\ u_{q\_b\_k} = u_{b\_k} - \left[R \cdot (i_{b\_k} + k_R \cdot 3i_{0\_k}) + L \cdot \frac{d(i_{b\_k} + k_L \cdot 3i_{0\_k})}{dt}\right] \\ u_{q\_c\_k} = u_{c\_k} - \left[R \cdot (i_{c\_k} + k_R \cdot 3i_{0\_k}) + L \cdot \frac{d(i_{c\_k} + k_L \cdot 3i_{0\_k})}{dt}\right] \\ k_R = \frac{R_0 - R_1}{3R_1} \quad k_L = \frac{L_0 - L_1}{3L_1} \end{cases} \qquad (17)$$

wherein $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$, represents zero sequence current at instant k; $K_R$ represents a factor determined based on $R_0$, $R_1$ as indicated in equation (17); $K_L$ represents a factor determined based on $L_0$, $L_1$ as indicated in equation (17).

Based on the principle of time domain lumped parameter differential equation for the transmission line, instantaneous voltage values at the compensation point q can be calculated from the sampling current values and voltage values at one end of the transmission line 20 for a series of time points, including three instantaneous voltage values $u_{q\_a\_k}$, $u_{q\_b\_k}$ and $u_{q\_c\_k}$ of phase-ground loop electric signals and three instantaneous voltage values $u_{q\_ab\_k}$, $u_{q\_bc\_k}$ and $u_{q\_ca\_k}$ of phase-phase loop electric signals. Namely, a mathematical link can be established based on the relations between the values of the sampled electric signals measured at the measurement point 13 and computed instantaneous voltage values at the compensation point q.

Voltage fault component of any of the six electrical loops at the compensation point q for sampling instant k can be computed from any of the equations (18-1) to (18-4) as below. The six electrical loops includes phase A to ground, phase B to ground, phase C to ground, phase A to phase B, phase B to phase C, and phase C to phase A.

$$\Delta u_{q\_k} = u_{q\_k} + u_{q\_k-N/2} \qquad (18\text{-}1)$$

$$\Delta u_{q\_k} = [u_{q\_k} + u_{q\_k-N/2}] - [u_{q\_k-N} + u_{q\_k-3N/2}] \qquad (18\text{-}2)$$

$$\Delta u_{q\_k} = u_{q\_k} - u_{q\_k-N} \qquad (18\text{-}3)$$

$$\Delta u_{q\_k} = [u_{q\_k} - u_{q\_k-N}] - [u_{q\_k-N} - u_{q\_k-2N}] \qquad (18\text{-}4)$$

wherein $\Delta u_{q\_k}$ indicates the voltage fault component of any of the six electrical loops at the compensation point q for sampling instant $u_{q\_k}$ indicates the voltage value of any of the six electrical loops at the compensation point q for sampling instant k, N indicates the number of sampling instant, preferably being equal to the number of sampling instant during the AC power system fundamental frequency cycle. In particular case such as for the electrical loop of phase A to ground, subscript "q_a" may be used in replacement of "q" in equations (18-1) to (18-4), and symbol "$\Delta u_{q\_k}$" changes to "$\Delta\Delta u_{q\_a\_k}$". For the phase B to ground, phase C to ground, phase A to phase B, phase B to phase C, and phase C to phase A, "$\Delta u_{q\_b\_k}$", "$\Delta u_{q\_c\_k}$", "$\Delta u_{q\_ab\_k}$", "$\Delta u_{q\_bc\_k}$", "$\Delta u_{q\_ca\_k}$" would be used in the specific scenarios.

Similarly, current fault component of any of the six electrical loops at the compensation point q for sampling instant k can be computed from any of the equations (19-1) to (19-4) as below. The six electrical loop includes phase A to ground, phase B to ground, phase C to ground, phase A to phase B, phase B to phase C, and phase C to phase A.

$$\Delta i_{q\_k} = i_{q\_k} + i_{q\_k-N/2} \quad (19\text{-}1)$$

$$\Delta i_{q\_k} = [i_{q\_k} + i_{q\_k-N/2}] - [i_{q\_k-N} + i_{q\_k-3N/2}] \quad (19\text{-}2)$$

$$\Delta i_{q\_k} = i_{q\_k} - i_{q\_k-N} \quad (19\text{-}3)$$

$$\Delta i_{q\_k} = [i_{q\_k} - i_{q\_k-N}] - [i_{q\_k-N} - i_{q\_k-2N}] \quad (19\text{-}4)$$

wherein $\Delta i_{q\_k}$ indicates the current fault component of any of the six electrical loops at the compensation point q for sampling instant k, $i_{q\_k}$ indicates the current value of any of the six electrical loops at the compensation point q for the sampling instant k, N indicates the number of sampling instant, preferably being equal to the number of sampling instant during the AC power system fundamental frequency cycle. In particular case such as for the electrical loop of phase A to ground, subscript "q_a" may be used in replacement of "q_" in equations (19-1) to (19-4), and symbol "$\Delta i_{q\_k}$" changes to "$\Delta i_{q\_a\_k}$". For the phase B to ground, phase C to ground, phase A to phase B, phase B to phase C, and phase C to phase A, "$\Delta i_{q\_b\_k}$", "$\Delta i_{q\_c\_k}$", "$\Delta i_{q\_ab\_k}$", "$\Delta i_{q\_bc\_k}$", "$\Delta i_{q\_ca\_k}$" would be used in the specific scenarios.

From the principle of electrical circuit, because the current flowing at the end of the transmission line is equal to that flowing the compensation point q, the sampling current values at the end of the transmission line can be used for the compensation point. Thus, the equations (19-1) to (19-4) can be reformulated as the equations (20-1) to (20-4).

$$\Delta i_{q\_k} = i_{e\_k} + i_{e\_k-N/2} \quad (20\text{-}1)$$

$$\Delta i_{q\_k} = [i_{e\_k} + i_{e\_k-N/2}] - [i_{e\_k-N} + i_{e\_k-3N/2}] \quad (20\text{-}2)$$

$$\Delta i_{q\_k} = i_{e\_k} - i_{e\_k-N} \quad (20\text{-}3)$$

$$\Delta i_{q\_k} = [i_{e\_k} - i_{e\_k-N}] - [i_{e\_k-N} - i_{e\_k-2N}] \quad (20\text{-}4)$$

wherein ie_k indicates the sampled current value of any of the six electrical loops at the end of the transmission line for sampling instant k. In particular case such as for the electrical loop of phase A to ground, subscript "q_a" may be used in replacement of "q_" and "e_" in equations (20-1) to (20-4), and symbol "$\Delta i_{q\_k}$" and "$\Delta i_{e\_k}$" change to "$\Delta i_{q\_a\_k}$" and "$\Delta i_{e\_a\_k}$". For the phase B to ground, phase C to ground, phase A to phase B, phase B to phase C, and phase C to phase A, "$\Delta i_{q\_b\_k}$", "$\Delta i_{e\_b\_k}$", "$\Delta i_{q\_c\_k}$", "$\Delta i_{e\_c\_k}$", "$\Delta i_{q\_ab\_k}$", "$\Delta i_{e\_ab\_k}$", "$\Delta i_{q\_bc\_k}$", "$\Delta i_{e\_bc\_k}$", "$\Delta i_{q\_ca\_k}$", "$\Delta i_{e\_ca\_k}$" would be used in the specific scenarios.

As an alternative, the instantaneous voltage values at a compensated point q on the power transmission line may be calculated based on traveling wave transmitting formula on distributed parameters of the power transmission line. Paper "Fault Phase Selector by Fault Component of Compensation Voltage Based on Traveling Wave", LI You-yi, DONG Xin-zhou, and SUN Yuan-zhang, Automation of Electric Power Systems, 2006, 30 (8), page 37-4 thus is incorporated here for reference.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A method for detecting fault in a transmission line of a power transmission system, including steps of:
   (a) obtaining a system parameter of the power transmission system;
   (b) adjusting protection reachability of a fault detecting element based on the obtained system parameter such that the adjusted protection reachability of the fault detecting element covers a predetermined protection range, wherein the protection reachability is a range of distance along the transmission line within which the fault detecting element is configured to detect fault conditions in the transmission line;
   (c) obtaining instantaneous voltage values at a compensated point on the transmission line of the power transmission system for a series of time points;
   (d) identifying whether there is an internal fault occurring on the transmission line using the adjusted fault detecting element by applying the obtained instantaneous voltage values at the compensated point to the adjusted fault detecting element for the identification of the internal fault, wherein the fault detecting element of the step (d) uses criteria:

$$\begin{cases} |\Delta U_q| > K_{rel} \times U \\ \Delta U_q = U_q - U_q' \end{cases}$$

where $U_q$ and $U_q'$ respectively indicate the instantaneous voltage values for two of the series of time points, where U is $U_q'$ or $U_N$, where $U_N$ indicates rated voltage of the transmission line, and $K_{rei}$ indicates reliability coefficient; and
   (e) generating a fault detection decision signal indicating the identified fault.

2. The method according to claim 1, wherein:
   the step (b) of adjusting includes:
   the reliability coefficient $K_{rei}$ of the fault detecting element is adjusted above a first threshold where the obtained system parameter is below a second threshold; and
   the reliability coefficient $K_{rei}$ of the fault detecting element is adjusted below the first threshold where the obtained system parameter is above the second threshold.

3. The method according to claim 2, further including:
   (f) sampling current values and voltage values at one end of the transmission line for the series of time points;
   wherein:
   the step (c) includes computing the instantaneous voltage values at the compensated point on the transmission line from the current value samples and the voltage value samples based on a time domain lumped parameter differential equation based on RLC model or RL model for the transmission line for the series of time points.

4. The method according to claim 1, wherein:
   the system parameter is SIR; and $$SIR = Z_S / Z_{Set}$$

where $Z_s$ is source impedance of the power transmission system, and $Z_{set}$ is impedance setting of the given transmission line.

5. The method according to claim 1, further including:
(f) sampling current values and voltage values at one end of the transmission line for the series of time points;
wherein:
the step (c) includes computing the instantaneous voltage values at the compensated point on the transmission line from the current value samples and the voltage value samples based on a time domain lumped parameter differential equation based on RLC model or RL model for the transmission line for the series of time points.

6. The method according to claim 5, wherein:
the step (b) of adjusting includes:
the reliability coefficient $K_{rei}$ of the fault detecting element is adjusted above a first threshold where the obtained system parameter is below a second threshold; and
the reliability coefficient $K_{rei}$ of the fault detecting element is adjusted below the first threshold where the obtained system parameter is above the second threshold.

7. A protection system for detecting fault in a transmission line of a power transmission system, including:
a processor, being configured to adjust protection reachability of a fault detecting element based on obtained system parameter of the power transmission system such that the adjusted protection reachability of the fault detecting element covers a predetermined protection range, identify whether there is an internal fault occurring on the transmission line using the adjusted fault detecting element, and generate a fault detection decision signal indicating the identified internal fault;
wherein:
the processor is further configured to apply obtained instantaneous voltage values at a compensated point to the adjusted fault detecting element for the identification of the internal fault, and the protection reachability is a range of distance along the transmission line within which the fault detecting element is configured to detect fault conditions in the transmission line, wherein the fault detecting element uses criteria:

$$\begin{cases} |\Delta U_q| > K_{rel} \times U \\ \Delta U_q = U_q - U_q' \end{cases}$$

where $U_q$ and $U_q'$ respectively indicate the instantaneous voltage values for two of the series of time points, where U is $U_q'$ or $U_N$, where $U_N$ indicates rated voltage of the transmission line, and $K_{rei}$ indicates reliability coefficient.

8. The protection system according to claim 7, wherein:
the reliability coefficient $K_{rei}$ of the fault detecting element is adjusted above a first threshold where the obtained system parameter is below a second threshold; and
the reliability coefficient $K_{rei}$ of the fault detecting element is adjusted below the first threshold where the obtained system parameter is above the second threshold.

9. The protection system according to claim 8, further including:
a sampling device, being configured to sample current values and voltage values at one end of the transmission line for the series of time points;
wherein:
the processor is further configured to compute the instantaneous voltage values at the compensated point on the transmission line from the current value samples and the voltage value samples based on a time domain lumped parameter differential equation based on RLC model or RL model for the transmission line for the series of time points.

10. The protection system according to claim 7, wherein:
the system parameter is SIR; and $$SIR=Z_s/Z_{set}$$

where $Z_s$ is source impedance of the power transmission system, and $Z_{set}$ is impedance setting of the transmission line.

11. The protection system according to claim 7, further including:
a sampling device, being configured to sample current values and voltage values at one end of the transmission line for the series of time points;
wherein:
the processor is further configured to compute the instantaneous voltage values at the compensated point on the transmission line from the current value samples and the voltage value samples based on a time domain lumped parameter differential equation based on RLC model or RL model for the transmission line for the series of time points.

12. The protection system according to claim 11, wherein:
the reliability coefficient $K_{rei}$ of the fault detecting element is adjusted above a first threshold where the obtained system parameter is below a second threshold; and
the reliability coefficient $K_{rei}$ of the fault detecting element is adjusted below the first threshold where the obtained system parameter is above the second threshold.

* * * * *